United States Patent
Takeuchi

(10) Patent No.: US 7,030,665 B2
(45) Date of Patent: Apr. 18, 2006

(54) VARIABLE DRIVE CURRENT DRIVER CIRCUIT

(75) Inventor: Junichi Takeuchi, Tokyo (JP)

(73) Assignee: NEC Electronics Corporation, (JP)

(*) Notice: Subject to any disclaimer, the term of this patent is extended or adjusted under 35 U.S.C. 154(b) by 0 days.

(21) Appl. No.: 10/647,582

(22) Filed: Aug. 25, 2003

(65) Prior Publication Data

US 2004/0036512 A1 Feb. 26, 2004

Related U.S. Application Data

(62) Division of application No. 09/874,737, filed on Jun. 5, 2001, now Pat. No. 6,646,482.

(30) Foreign Application Priority Data

Jun. 5, 2000 (JP) ............................. 2000-167798

(51) Int. Cl.
*H03B 1/00* (2006.01)
(52) U.S. Cl. .......................... 327/112; 327/170; 326/83
(58) Field of Classification Search ........ 377/108–112, 377/170, 379, 389, 391, 65, 67; 326/26, 326/27, 30, 82, 83, 86, 87
See application file for complete search history.

(56) References Cited

U.S. PATENT DOCUMENTS

| 5,450,026 A | 9/1995 | Morano ........................ 326/84 |
| 5,898,326 A | 4/1999 | Okayasu ...................... 327/112 |
| 5,949,253 A * | 9/1999 | Bridgewater, Jr. ........... 326/86 |
| 5,977,796 A | 11/1999 | Gabara ......................... 326/86 |
| 6,111,431 A | 8/2000 | Estrada ........................ 326/83 |
| 6,194,949 B1 * | 2/2001 | Hogeboom ................. 327/391 |
| 6,281,715 B1 * | 8/2001 | DeClue et al. .............. 327/108 |
| 6,292,028 B1 | 9/2001 | Tomita ......................... 326/86 |
| 6,313,662 B1 | 11/2001 | Ide ............................... 326/83 |
| 6,329,843 B1 | 12/2001 | Hirata et al. .................. 326/82 |

FOREIGN PATENT DOCUMENTS

| JP | 63282868 A | 11/1988 |
| JP | 09214314 A | 8/1997 |
| JP | 10270992 A | 10/1998 |
| JP | 10326489 A | 12/1998 |
| JP | 11-085343 | 3/1999 |
| JP | 2000-353035 | 12/2000 |

* cited by examiner

*Primary Examiner*—Long Nguyen
(74) *Attorney, Agent, or Firm*—Hayes Soloway P.C.

(57) ABSTRACT

Disclosed is a variable drive current driver circuit, comprising: a pair of push-pull circuits for driving a load circuit complementarily; a first current source circuit for having a bias current flow into the pair of push-pull circuits; a second current source circuit for having the bias current flow out of the pair of push-pull circuits; and a control circuit for varying both the bias current flowed by the first current source circuit and the bias current flowed by the second current source circuit according to a control signal.

14 Claims, 5 Drawing Sheets

US 7,030,665 B2

VARIABLE DRIVE CURRENT DRIVER CIRCUIT

CROSS-REFERENCE TO RELATED APPLICATION

This application is a Divisional of U.S. application Ser. No. 09/874,737, filed Jun. 5, 2001 now U.S. Pat. No. 6,646,482.

BACKGROUND OF THE INVENTION

1. Field of the Invention

The present invention relates to a variable drive current driver circuit.

2. Description of the Prior Art

According to the conventional standards, such as IEEE 1394 standards, a drive current of a signal transmitted between electronic devices, such as personal computers, video movies, or mini-disc players, connected mutually via a cable or the like is determined so as to become either of two kinds. When a certain electronic device is connected to another electronic device via a cable, the former have the latter notify the former of the standard of a signal that can be received by the latter, and the former transmits data with a drive current determined on the basis of this notification.

FIG. 1 is a diagram showing a conventional driver circuit that is capable of varying a drive current of a signal. In the conventional technique, as shown in FIG. 1, a driver circuit for either a standard A or a standard B is driven on the basis of, for example, a control signal of "0" or "1," so as to be able to cope where the electronic device of the opposite party receives a signal of either of the two kinds of drive current defined by the standard.

In other words, if a control signal of "1" is inputted to the standard A driver circuit and the standard B driver circuit, then the standard A driver circuit is enabled and the standard B driver circuit is disabled. If a control signal of "0" is inputted to the standard A driver circuit and the standard B driver circuit, then the standard A driver circuit is disabled and the standard B driver circuit is enabled.

In the conventional technique, however, it is necessary to prepare as many driver circuits as the number of kinds of the driver current defined by the standard. As a result, the circuit scale becomes large as the number of kinds of the drive current increases, especially in an electronic device, where transmission and reception of a plurality of data are performed using one physical layer LSI, it is especially desired to prevent the circuit scale from becoming large.

SUMMARY OF THE INVENTION

Therefore, the object of the present invention is to provide a variable drive current driver circuit having a small scale.

According to the first aspect of the present invention, there is provided a variable drive current driver circuit, comprising: a pair of push-pull circuits for driving a load circuit complementarily; a first current source circuit for having a bias current flow into the pair of push pull circuits; and a control circuit for varying both the bias current flowed by the first current source circuit and the bias current flowed by the second current source circuit according to a control signal.

In the variable drive current driver circuit, the first current source circuit comprises a current mirror circuit, and the control circuit controls an input current of the current mirror circuit according to the control signal.

In the variable drive current driver circuit, the control circuit may control the input current by controlling a control terminal voltage of a transistor for flowing the input current.

In the variable drive current driver circuit, the control of the control terminal voltage may be performed by changing, by a transistor which turns on or off according to the control signal, a magnitude of a load which flows through the output.

In the variable drive current driver circuit, the second current source circuit may comprise a transistor, and the control circuit may control a control terminal voltage of the transistor according to the control signal.

In the variable drive current driver circuit, the control of the second current source circuit may be performed by changing, by a transistor which turns on or off according to the control signal, a magnitude of a load which flows through the output.

According to a second aspect of the present invention, there is provided a variable drive current driver circuit, comprising: a pair of push-pull circuits for driving a load circuit complementarily; a first current source circuit for having a first bias current flow into the pair of push-pull circuits; a second current source circuit for having the first bias current flow out of the pair of push-pull circuits; a third current source circuit capable of having a second bias current flow into the pair of push-pull circuits; a fourth current source circuit capable of having the second bias current flow out of the pair of push-pull circuits; and a control circuit for varying both the second bias current flowed by the third current source circuit and the second bias current flowed by the fourth current source circuit according to a control signal.

In the variable drive current driver circuit, the control circuit mayhave the third current source circuit have the second bias current flow nor not flow into the pair of push-pull circuit, and the control circuit may have the fourth current source circuit have the second bias current flow or not flow out of the push-pull circuit.

DESCRIPTION OF THE PREFERRED EMBODIMENTS

Hereinafter, embodiments of the present invention will be described with reference to the drawings.

Figure 1:
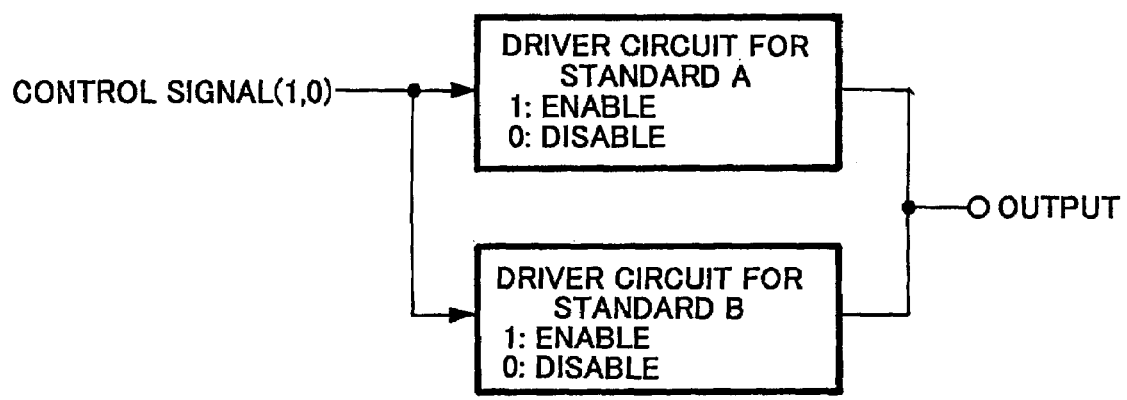
FIG. 1 is a diagram showing a variable drive current driver circuit according to a conventional technique.
Figure 2:
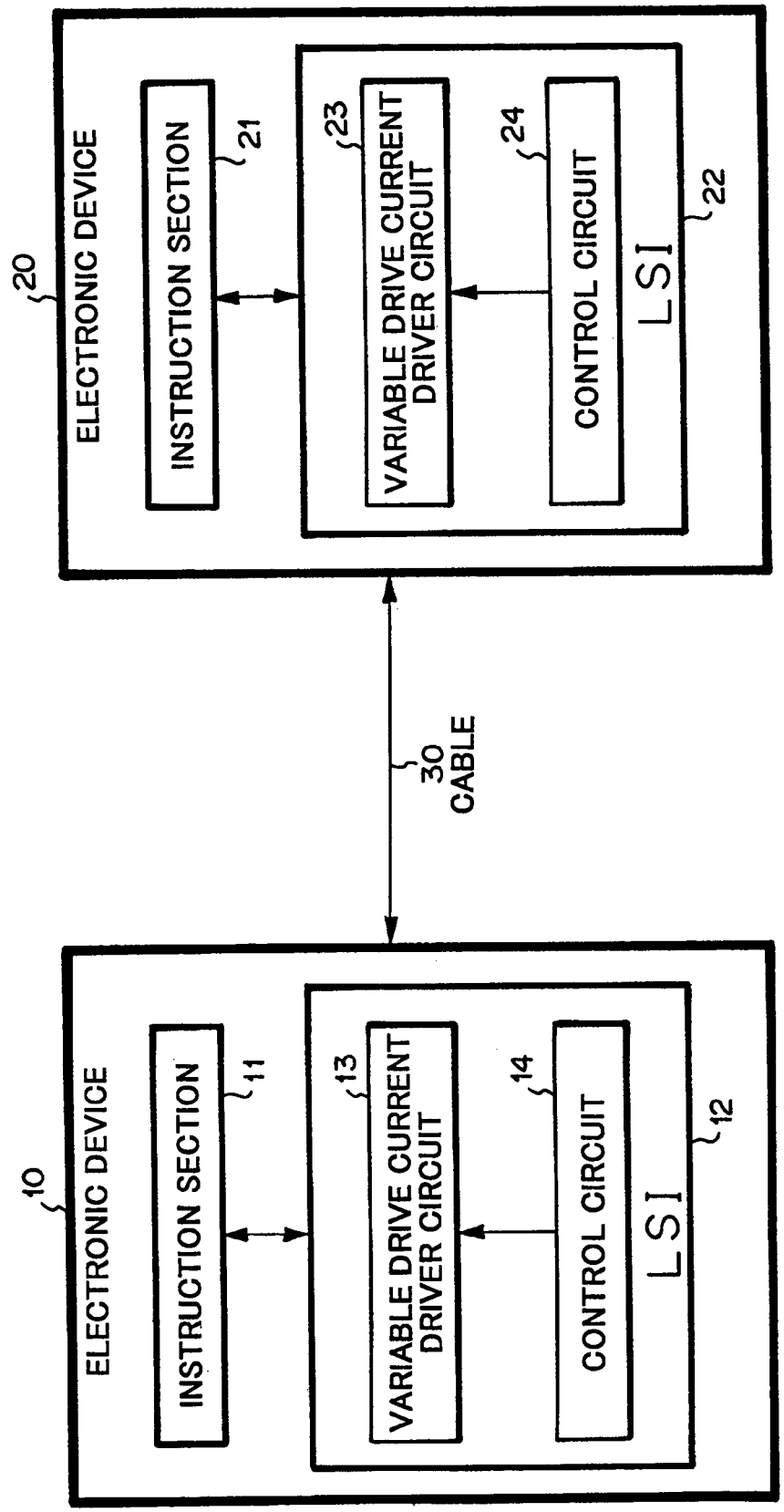
FIG. 2 is a diagram showing such a state that electronic devices each incorporating a variable drive current driver circuit according to an embodiment of the present invention are connected to each other.

FIG. 2 is a block diagram showing the configuration of a transmission system of the first embodiment according to the present invention. FIG. 2 shows a state that electronic devices 10 and 20 are connected to each other via a cable 30. The electronic devices 10 and 20 include LSIs 12 and 22, and instruction sections 11 and 21 for monitoring the operation of the LSIs 12 and 22 and instructing generation, transmission and reception of data mutually transmitted to the electronic devices 20 and 10, respectively. The LSIs 12 and 22 incorporate variable drive current driver circuits 13 and 23 for transmitting data adjusted in drive current so that the data are received by the electronic devices 20 and 10, and control circuits 14 and 24 for generating and outputting control signals to control drive currents of data transmitted by the variable drive current driver circuits 13 and 23, respectively.

Each of the instruction sections 11 and 21 is controlled by a CPU, which operates according to software and which is not illustrated. The control circuits 14 and 24 are incorporated in the LSIs 12 and 22 together with the variable drive current driver circuits 13 and 23, respectively.

Figure 3:
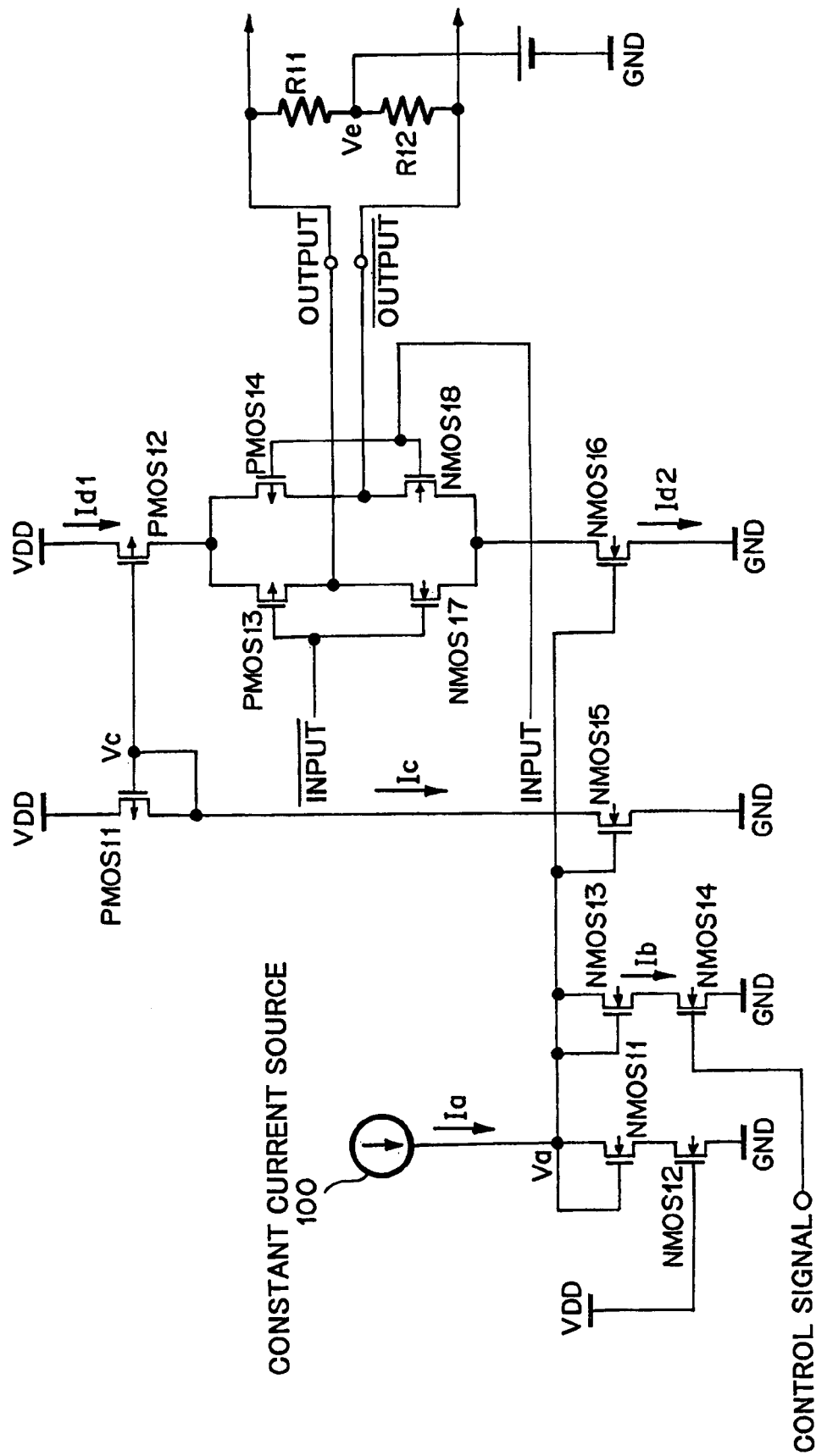
FIG. 3 is a circuit diagram showing the configuration of a variable drive current driver circuit according to a first embodiment of the present invention.

FIG. 3 is a circuit diagram showing the first embodiment of the variable drive current driver circuit shown in FIG. 2.

With reference to FIG. 3, the variable drive current driver circuit according to the first embodiment is supplied with a constant current Ia from a constant current source 100. On the basis of the constant current Ia, the variable drive current driver circuit generates an output current. First, a current Ic is generated by a current mirror formed of transistors NMOS 11, NMOS 12 and NMOS 15. From the current Ic, a constant current Id1 is further generated by a current mirror formed of transistors PMOS 11 and PMOS 12. Concurrently with them, a constant current Id2 is generated by a current mirror formed of transistors NMOS 11, NMOS 12 and NMOS 16. In this case it is necessary to design the drive circuit so as to satisfy the relation Id1=Id2 in order to balance the output currents. The current Id1 is outputted from the driver circuit to the outside, passed through resistors R11 and R12, and drawn in as the current Id2. The output voltage is determined by the value of the current Id1 and values of the resistors R11 and R12. A node Ve between the resistor R11 and the resistor R12 is a node of a common level. This node is supplied with a constant potential from a constant voltage source mainly including an operational amplifier.

By the way, transistors PMOS 13 and NMOS 17 form a first push-pull circuit, whereas transistors PMOS 14 and NMOS 18 form a second push-pull circuit. Since a signal inputted to gates of the transistors PMOS 13 and NMOS 17 is complementary to a signal inputted to gates of the transistors PMOS 14 and NMOS 18, the first push-pull circuit and the second push-pull circuit complementarily drive the resistors R11 and R12 serving as a load circuit.

In accordance with the present invention, transistors NMOS 13 and NMOS 14 and a control signal input terminal are further added. The logic values of a control corresponds to CMOS levels. According to the logic value, the value of the drive current changes. In a case where the logic value of the control signal is "1," a current Ib flows and a voltage Va becomes Va1. On the other hand, in a case where the logic value of the control signal is "0," the current Ib does not flow and the voltage Va becomes Va2, wherein Va2>Va1. The currents Ic, Id1 and Id2 when the logic value of the control signal is "0" are larger than those when the logic value of the control signal is "1", respectively. As a result, the control signal can generate two different drive current(s).

Figure 4:
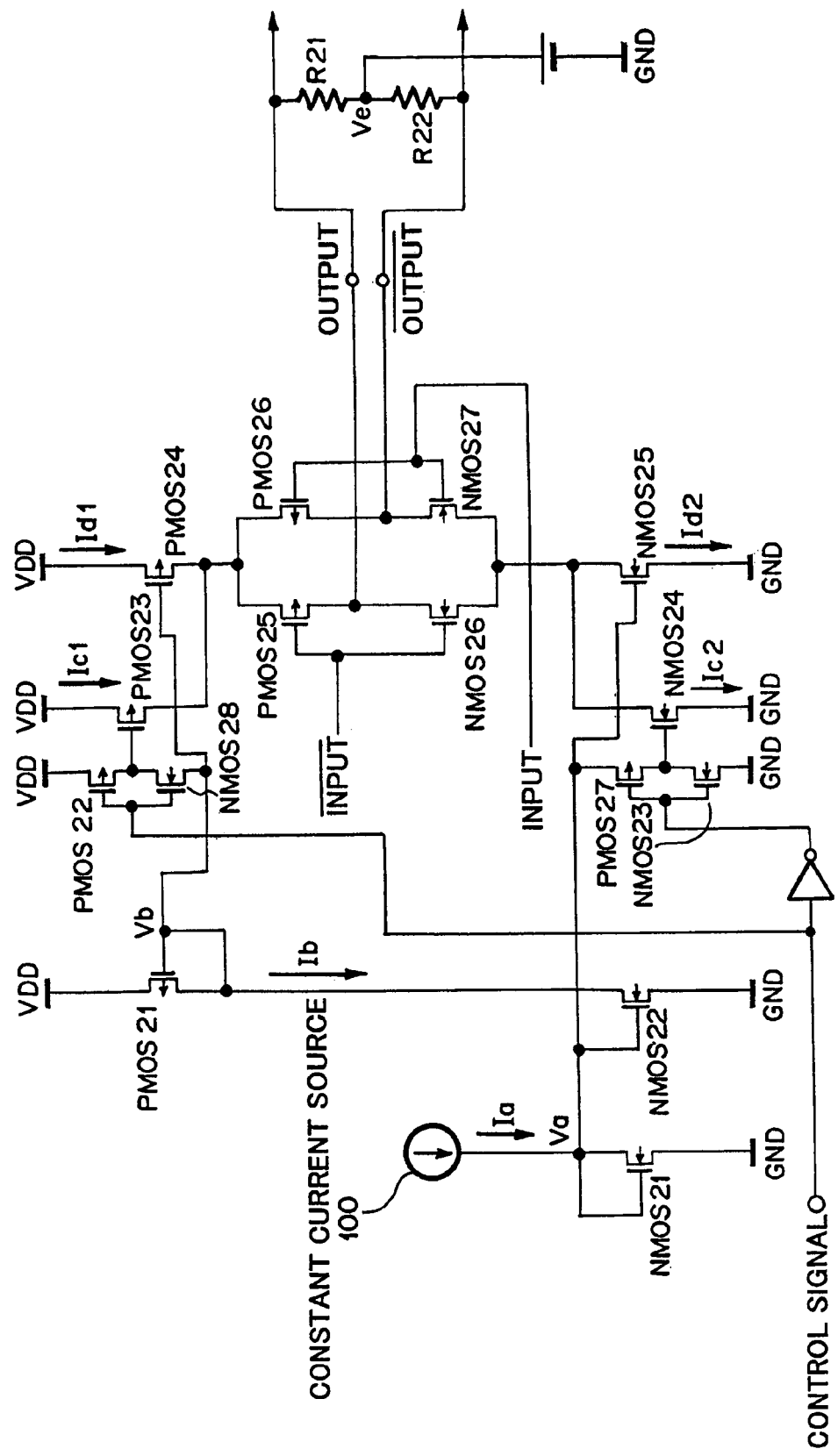
FIG. 4 is a circuit diagram showing the configuration of a variable drive current driver circuit according to a second embodiment of the present invention.

FIG. 4 is a circuit diagram showing a second embodiment of a variable drive current driver circuit shown in FIG. 2.

Comparing FIG. 4 with FIG. 3, it is apparent that the variable drive current driver circuit according to the second embodiment differs from the variable drive current driver circuit according to the first embodiment in that a control circuit, including transistors PMOS 24, PMOS 25, PMOS 26, NMOS 25, NMOS 26 and NMOS 27, is added to an output stage. In the variable drive current driver circuit according to the first embodiment, the control circuit is added not to the output stage but to the constant current source side. In FIG. 4, the voltage Va is constant. In a case where the logic value of the control signal is "1," currents Ic1 and Ic2 flow. In a case where the logic value of the control signal is "0," currents Ic1 and Ic2 do not flow. When the logic value of the control signal is "1," therefore, the sum of currents Ic1 and Id1 or the sum of currents Ic2 and Id2 becomes the drive current. When the logic value of the control signal is "0," only the current Id1 or Id2 becomes the drive current. Accordingly it is possible that Ic1=Ic2 and Id1=Id2.

Like the variable drive current driver circuit according to the first embodiment, the variable drive current driver circuit according to the second embodiment has two kinds of drive current controlled by the control signal.

Figure 5:
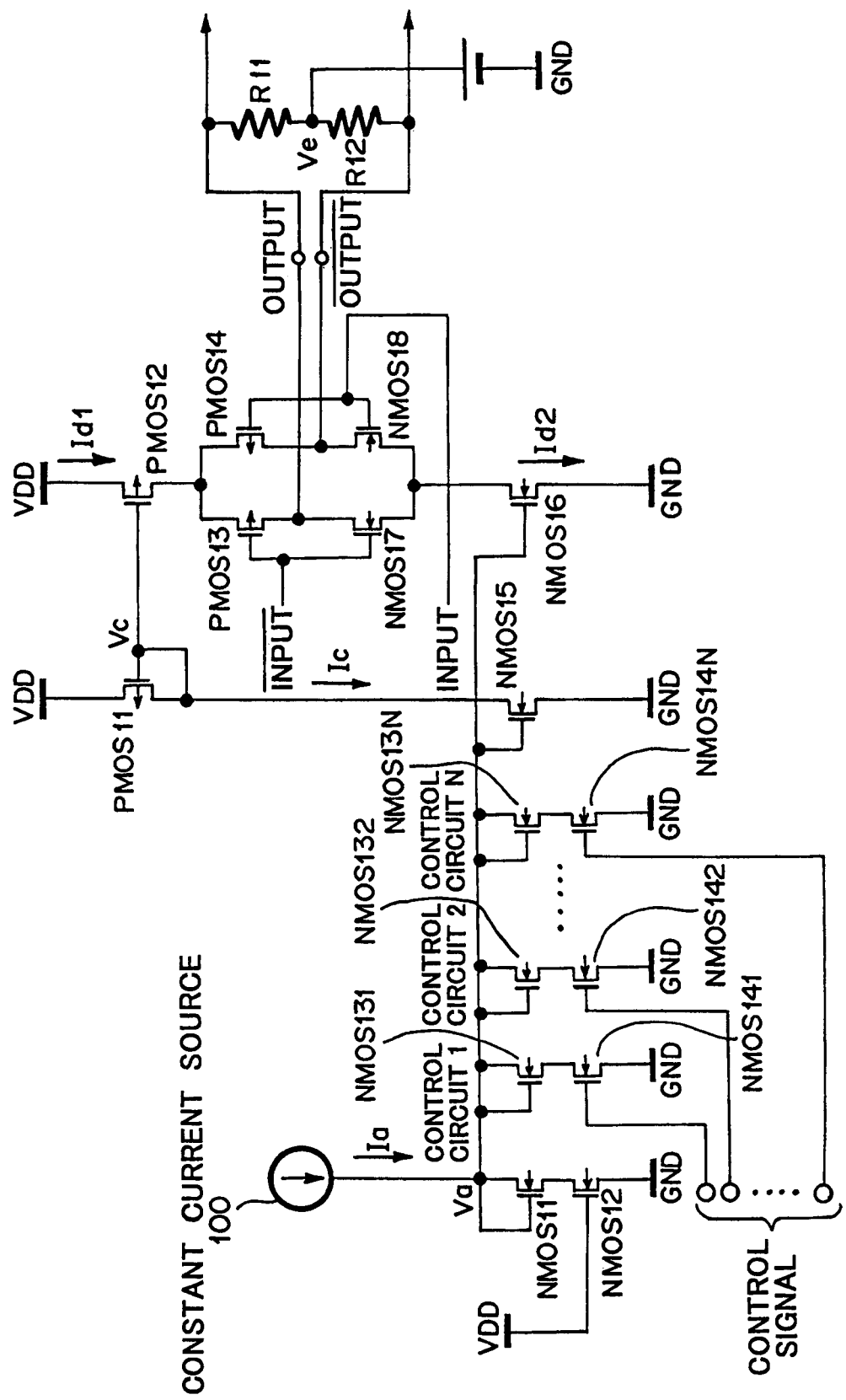
FIG. 5 is a circuit diagram showing the configuration of a variable drive current driver circuit according to a third embodiment of the present invention.

FIG. 5 is a circuit diagram showing the third embodiment of a variable drive current driver circuit shown in FIG. 2.

Comparing FIG. 5 with FIG. 3, it is apparent that the variable drive current driver circuit according to the third embodiment is structured by preparing a plurality of sets of the transistors NMOS 13 and NMOS 14 of the variable drive current driver circuit according to the first embodiment and connecting the sets in parallel. Transistors NMOS 131, NMOS 141, NMOS 132, NMOS 142, . . . , NMOS 13N and NMOS 14N correspond to the plurality of sets of the transistors NMOS 13 and NMOS 14. Gates of the transistors NMOS 141, NMOS 142 . . . NMOS 14N are supplied with their respective control signals. Therefore, the variable drive current driver circuit according to the third embodiment can drive its load with a plurality of drive currents.

It is a matter of course that, like the circuit of the third embodiment, the variable drive current driver circuit according to the second embodiment can be expanded to enable the circuit to drive its load with a plurality of drive currents. To expand the circuit of FIG. 4, or the second embodiment, a plurality of sets of the transistors PMOS 22, PMOS 23 and NMOS 28 are prepared. The plurality of sets are connected in parallel with the transistor PMOS 24. A plurality of sets of the transistors NMOS 23, NMOS 24 and PMOS 27 are prepared. The plurality of sets are connected in parallel with the transistor NMOS 25.

What is claimed is:

1. A variable drive current driver circuit, comprising:
    a pair of push-pull circuits for driving a load circuit complementarily;
    a first current source circuit for having a first bias current flow to said pair of push-pull circuits;
    a second current source circuit for having said first bias current flow from said pair of push-pull circuits;
    a third current source circuit capable of having a second bias current flow to said pair of push-pull circuits;
    a fourth current source circuit capable of having said second bias current flow from said pair of push-pull circuits; and
    a control circuit for varying both said second bias current driven by said third current source circuit and said second bias current driven by said fourth current source circuit according to a control signal,
    wherein each push-pull circuit comprises two transistors having their gates directly connected together.

2. The variable drive current driver circuit according to claim 1, wherein
    said control circuit controls whether said second bias current driven by said third current source flows to said pair of push-pull circuits, and
    said control circuit controls whether said second bias current driven by said fourth current source flows from said push-pull circuits.

3. The variable drive current driver circuit according to claim 1,
wherein said first bias current is a constant current.

4. A variable drive current driver circuit, comprising:
a pair of push-pull circuits for driving a load circuit complementarily;
a first current source circuit for having a first bias current flow to said pair of push-pull circuits;
a second current source circuit for having said first bias current flow from said pair of push-pull circuits;
a third current source circuit capable of having a second bias current flow to said pair of push-pull circuits;
a fourth current source circuit capable of having said second bias current flow from said pair of push-pull circuits; and
a control circuit for varying both said second bias current driven by said third current source circuit and said second bias current driven by said fourth current source circuit according to a control signal,
wherein each push-pull circuit comprises at least two conductive types of transistors having their gates directly connected together.

5. The variable drive current driver circuit according to claim 4, wherein
said control circuit controls whether said second bias current driven by said third current source flows to said pair of push-pull circuits, and
said control circuit controls whether said second bias current driven by said fourth current source flows from said push-pull circuits.

6. A variable drive current driver circuit, comprising:
a pair of push-pull circuits for driving a load circuit complementarily;
a first current source circuit for having a first bias current flow to said pair of push-pull circuits;
a second current source circuit for having a second bias current flow from said pair of push-pull circuits;
a third current source circuit capable of having a third bias current flow to said pair of push-pull circuits;
a fourth current source circuit capable of having a fourth bias current flow from said pair of push-pull circuits; and
a control circuit for varying both said third bias current driven by said third current source circuit and said fourth bias current driven by said fourth current source circuit according to a control signal,
wherein each push-pull circuit comprises two transistors having their gates directly connected together.

7. The variable drive current driver circuit according to claim 6, wherein
said control circuit controls whether said third bias current driven by said third current source flows to said pair of push-pull circuits, and
said control circuit controls whether said fourth bias current driven by said fourth current source flows from said push-pull circuits.

8. The variable drive current driver circuit according to claim 6,
wherein said first bias current is a constant current.

9. The variable drive current driver circuit according to claim 6,
wherein said second bias current is a constant current.

10. A variable drive current driver circuit comprising:
a pair of push-pull circuits for driving a load circuit complementarily;
a first current source circuit for having a first bias current flaw to said pair of push-pull circuits;
a second current source circuit for having said first bias current flow from said pair of push-pull circuits;
a third current source circuit capable of having a second bias current flow to said pair of push-pull circuits;
a fourth current source circuit capable of having said second bias current flow from said pair of push-pull circuits; and
a control circuit for turning on or off both said second bias current driven by said third current source circuit and said second bias current driven by said fourth current source circuit according to a control signal,
wherein each push-pull circuit comprises at least two different types of transistors, and
wherein said first bias current is a constant current.

11. A variable drive current driver circuit, comprising:
a pair of push-pull circuits for driving a load circuit complementarily;
a first current source circuit for having a first bias current flow to said pair of push-pull circuits;
a second current source circuit for having a second bias current flow from said pair of push-pull circuits;
a third current source circuit capable of having a third bias current flaw to said pair of push-pull circuits;
a fourth current source circuit capable of having a fourth bias current flow from said pair of push-pull circuits; and
a control circuit for varying both said third bias current driven by said third current source circuit and said fourth bias current driven by said fourth current source circuit according to a control signal,
wherein each push-pull circuit comprises at least two conductive types of transistors having their gates directly connected together.

12. The variable drive current driver circuit according to claim 11, wherein
said control circuit controls whether said third bias current driven by said third current source flows to acid pair of push-pull circuits, and
said control circuit controls whether said fourth bias current driven by said fourth current source flows from said push-pull circuit.

13. A variable drive current driver circuit, comprising:
a pair of push-pull circuits for driving a load circuit complementarily;
a first current source circuit for having a first bias current flow to said pair of push-pull circuits;
a second current source circuit for having a second bias current flow from said pair of push-pull circuits;
a third current source circuit capable of having a third bias current flow to said pair of push-pull circuits;
a fourth current source circuit capable of having a fourth bias current flow from said pair of push-pull circuits; and
a control circuit for turning on or off bat said third bias current driven by said third current source circuit and said fourth bias current driven by said fourth current source circuit according to a control signal,
wherein each push-pull circuit comprises at least two different types of transistors, and
wherein said first bias current is a constant current.

14. A variable drive current driver circuit, comprising:
a pair of push-pull circuits for driving a load circuit complementarily;
a first current source circuit for having a first bias current flow to said pair of push-pull circuits;
a second current source circuit for having a second bias current flow from said pair of push-pull circuits;

a third current source circuit capable of having a third bias current flow to said pair of push-pull circuits;

a fourth current source circuit capable of having a fourth bias current flow from said pair of push-pull circuits; and a control circuit for turning on or off both said third bias current driven by said third current source circuit and said fourth bias current driven by said fourth current source circuit according to a control signal, wherein each push-pull circuit comprises at least two different types of transistors, and wherein said second bias current is a constant current.

* * * * *

UNITED STATES PATENT AND TRADEMARK OFFICE
CERTIFICATE OF CORRECTION

PATENT NO. : 7,030,665 B2  
APPLICATION NO. : 10/647582  
DATED : April 18, 2006  
INVENTOR(S) : Takeuchi Page 1 of 1

It is certified that error appears in the above-identified patent and that said Letters Patent is hereby corrected as shown below:

Claim 10, Column 5, Line 67, "flaw" should be --flow--;

Claim 11, Column 6, Line 23, "flaw" should be --flow--; and

Claim 12, Column 6, Line 37, "acid" should be --said--.

Signed and Sealed this

First Day of August, 2006

JON W. DUDAS  
*Director of the United States Patent and Trademark Office*